(12) United States Patent
Onizawa et al.

(10) Patent No.: US 6,977,834 B2
(45) Date of Patent: Dec. 20, 2005

(54) SEMICONDUCTOR INTEGRATED CIRCUIT DEVICE

(75) Inventors: Tadashi Onizawa, Yokohama (JP);
Tsuyoshi Midorikawa, Yokohama (JP);
Shigeyuki Hayakawa, Yokosuka (JP);
Yutaka Tanaka, Yokohama (JP)

(73) Assignee: Kabush″ei Kaishr Toshiba, Tokyo (JP)

( * ) Notice: Subject to any disclaimer, the term of this patent is extended or adjusted under 35 U.S.C. 154(b) by 6 days.

(21) Appl. No.: 10/769,192

(22) Filed: Jan. 29, 2004

(65) Prior Publication Data

US 2005/0111267 A1    May 26, 2005

(30) Foreign Application Priority Data

Nov. 21, 2003 (JP) .............................. 2003-393035

(51) Int. Cl.$^7$ .................................................. G11C 5/06
(52) U.S. Cl. ..................................... 365/63; 365/230.06
(58) Field of Search ..................... 365/63, 205, 230.06

(56) References Cited

U.S. PATENT DOCUMENTS

| | | | | |
|---|---|---|---|---|
| 5,022,006 A | * | 6/1991 | Fifield et al. | 365/200 |
| 5,349,556 A | * | 9/1994 | Lee | 365/200 |
| 5,402,380 A | * | 3/1995 | Kumakura et al. | 365/185.08 |
| 5,699,306 A | * | 12/1997 | Lee et al. | 365/200 |
| 5,999,482 A | | 12/1999 | Kornachuk et al. | |
| 6,201,757 B1 | * | 3/2001 | Ward et al. | 365/230.05 |
| 6,741,505 B2 | * | 5/2004 | Yokozeki | 365/189.07 |

* cited by examiner

*Primary Examiner*—Michael Tran
(74) *Attorney, Agent, or Firm*—DLA Piper Rudnick Gray Cary US LLP.

(57) ABSTRACT

A semiconductor integrated circuit device includes normal bit cells, structural dummy bit cells and timing dummy bit cells having the same structure as that of the normal bit cells, normal word lines electrically connected to the normal bit cells, a first dummy word line electrically coupled to the structural dummy bit cells, and a second dummy word line electrically coupled to the timing dummy bit cells. The second dummy word line is connected in parallel with the first dummy word line.

10 Claims, 11 Drawing Sheets

Ldw>>>>Lcl

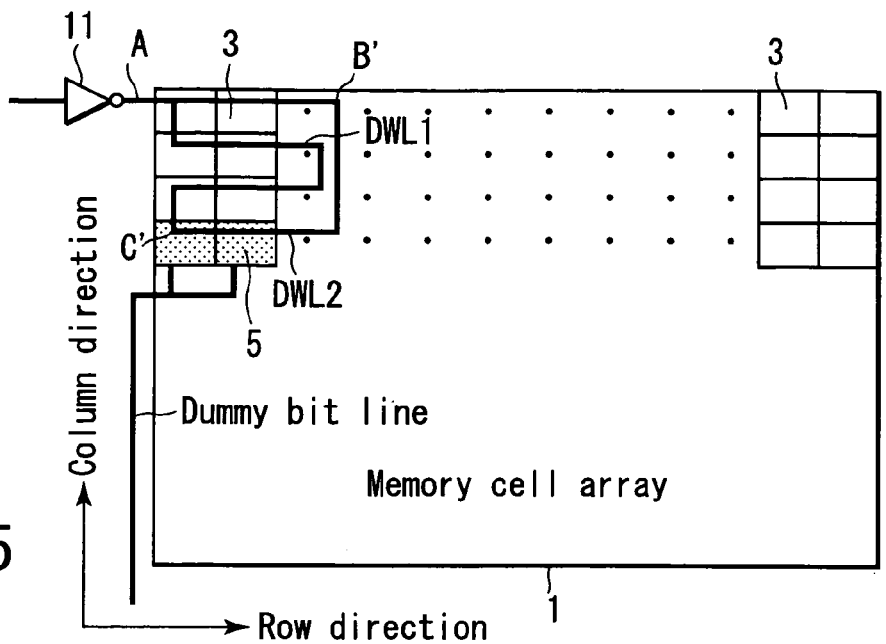
FIG. 15
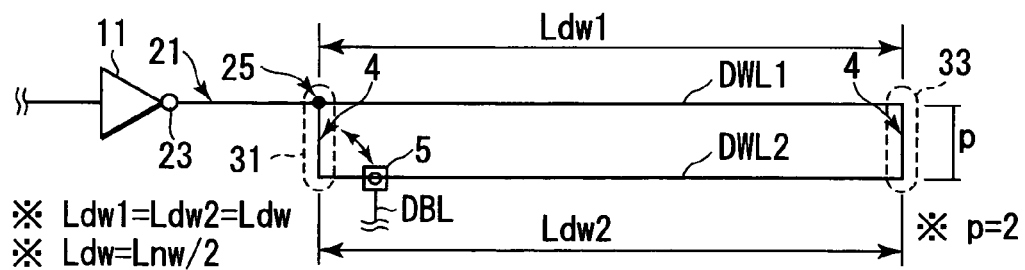
FIG. 16
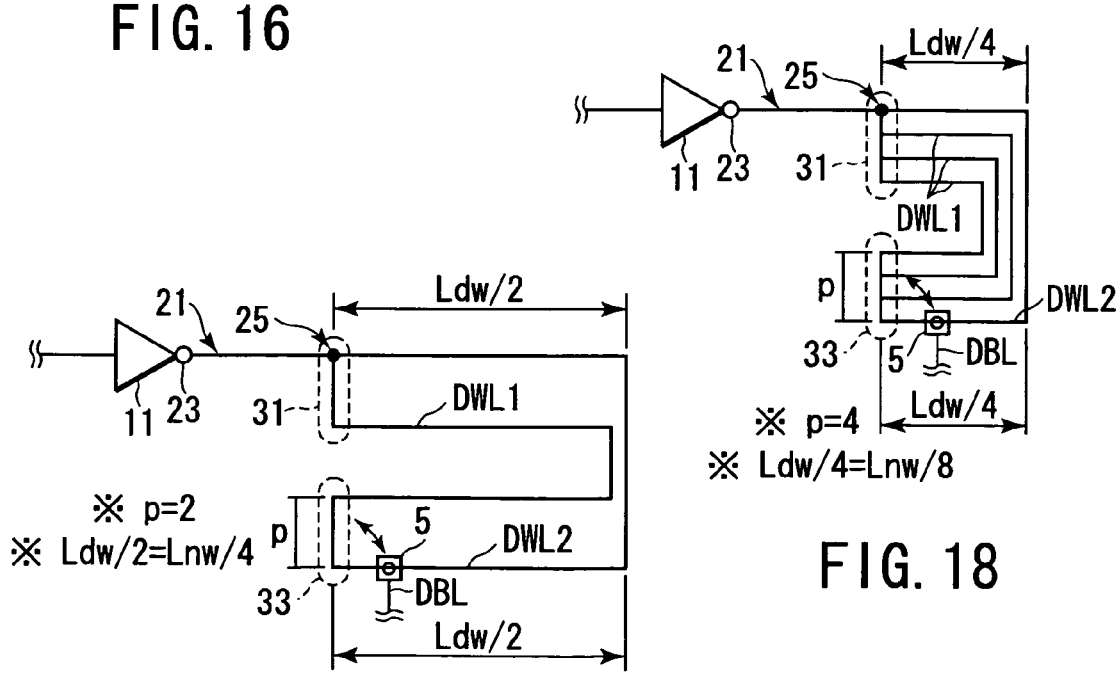
FIG. 17
FIG. 18

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2003-393035, filed Nov. 21, 2003, the entire contents of which are incorporated herein by reference.

BACKGROUND OF THE INVENTION

1. Field of the Invention

This invention relates to a semiconductor integrated circuit device and more particularly to a semiconductor integrated circuit device having dummy word lines.

2. Description of the Related Art

A dummy word line is used to drive a timing dummy bit cell and create a control signal which controls data reading timing, for example. Since it is required for the dummy word line to behave in the same manner as the normal word line, it is desirable to lay out the dummy word lines like the word lines. As a known reference which discloses the dummy word line, for example, U.S. Pat. No. 5,999,482 is provided.

Unlike the normal word line, since the dummy word line is driven each time the semiconductor memory is accessed, the frequency of application of voltage to the dummy word line is extremely larger in comparison with the frequency of application of voltage to the normal word line. Therefore, the possibility that a line breaking accident occurs due to electromigration becomes stronger in comparison with the case of the normal word line and will function as one factor which controls the service life of the device.

BRIEF SUMMARY OF THE INVENTION

A semiconductor integrated circuit device according to an aspect of the present invention comprises a plurality of normal bit cells; a plurality of structural dummy bit cells having the same structure as that of the plurality of normal cell bit cells; a plurality of timing dummy bit cells having the same structure as that of the plurality of normal cell bit cells; normal word lines electrically coupled to the plurality of normal bit cells; a first dummy word line electrically coupled to the plurality of structural dummy bit cells; and a second dummy word line electrically coupled to the plurality of timing dummy bit cells and connected in parallel with the first dummy word line.

BRIEF DESCRIPTION OF THE SEVERAL VIEWS OF THE DRAWING

FIG. 15 is a plan view showing a semiconductor integrated circuit device according to a sixth embodiment of this invention;

FIG. 16 is a diagram showing the relation between a parallel-connected dummy word lines and a timing dummy bit cell;

FIG. 17 is a diagram showing a first example of the parallel-connected dummy word line which the semiconductor integrated circuit device according to the sixth embodiment of this invention has;

FIG. 18 is a diagram showing a second example of the parallel-connected dummy word line which the semiconductor integrated circuit device according to the sixth embodiment of this invention has;

DETAILED DESCRIPTION OF THE INVENTION

There will now be described some embodiments of this invention with reference to the accompanying drawings. In this explanation, common reference symbols are attached to common portions throughout the drawings.

(First Embodiment)

Figure 1:
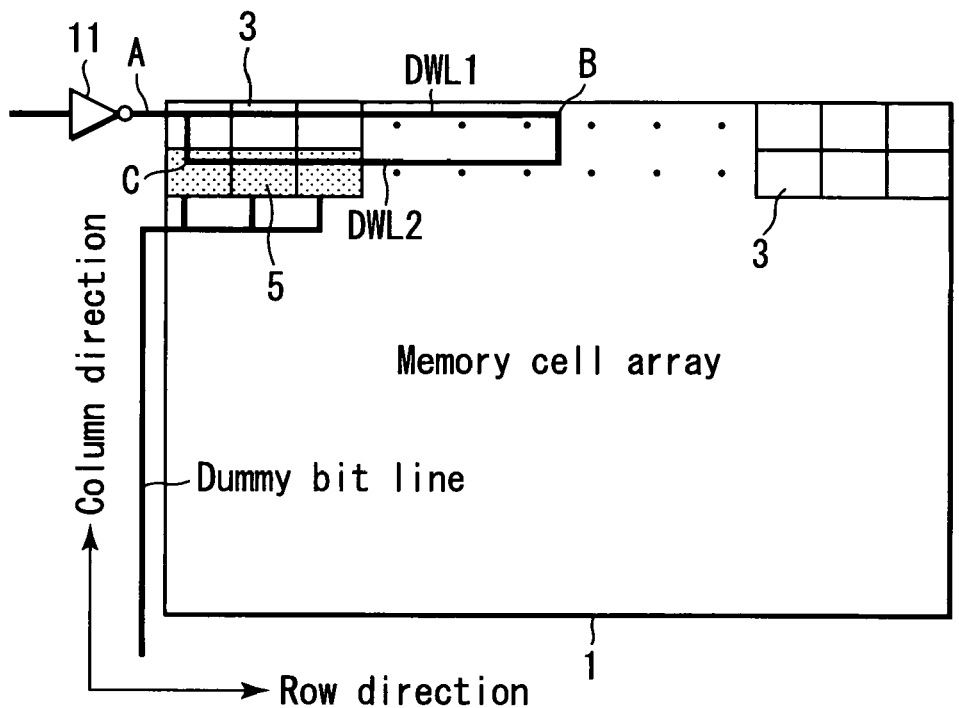
FIG. 1 is a plan view showing a semiconductor integrated circuit device according to a first embodiment of this invention.
Figure 2:
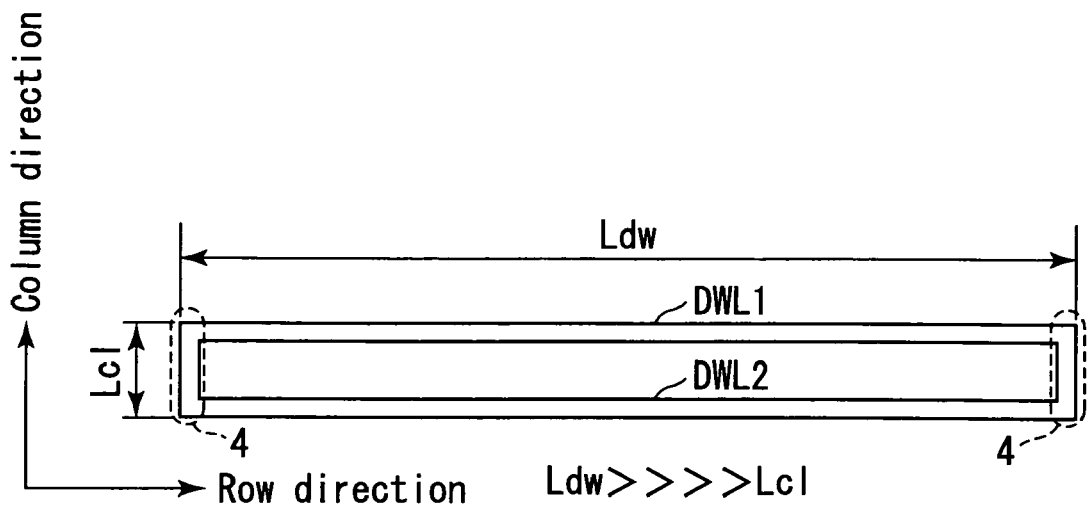
FIG. 2 is a plan view showing one example of a dummy word line.

FIG. 1 is a plan view schematically showing a semiconductor integrated circuit device according to a first embodiment of this invention. Particularly, FIG. 1 shows the concept of a method for laying out dummy word lines according to the first embodiment. FIG. 2 is a plan view showing one example of dummy word lines and FIG. 3 is a block diagram showing one circuit example of the device according to the first embodiment.

Figure 3:
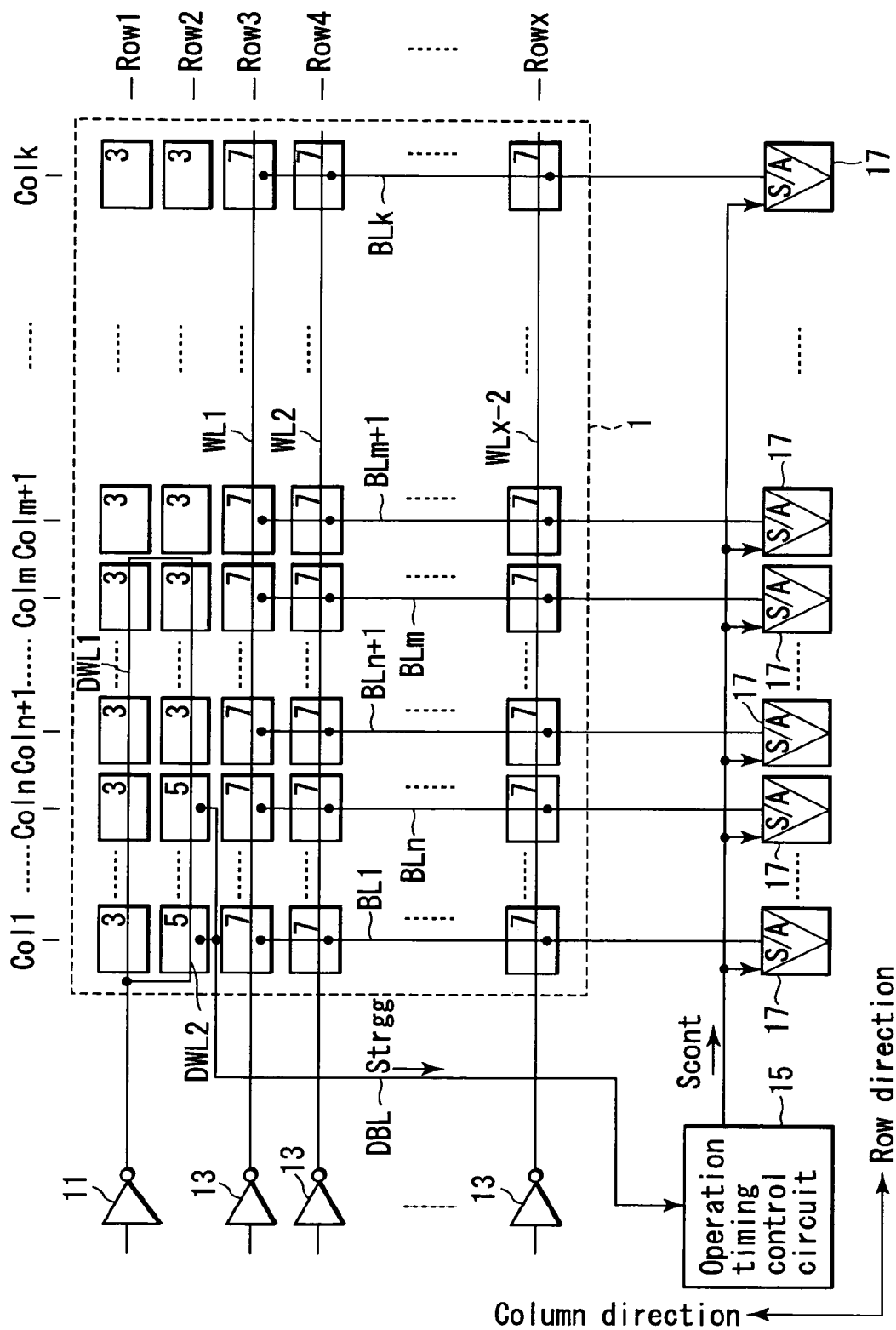
FIG. 3 is a block diagram showing one circuit example of the semiconductor integrated circuit device according to the first embodiment of this invention.

As shown in FIGS. 1 to 3, a memory cell array 1 is formed on a semiconductor chip. A plurality of structural dummy bit cells 3, a plurality of timing dummy bit cells 5 and a plurality of normal bit cells 7 are formed in the memory cell array 1. In this example, the structural dummy bit cells 3 are arranged on a first row (Row1) of the memory cell array 1, the structural dummy bit cells 3 and timing dummy bit cells 5 are arranged on a second row (Row2), and the normal bit cells 7 are arranged on the other rows (Row3 to Rowx). The structural dummy bit cells 3 and timing dummy bit cells 5 each have the same or substantially the same capacitance as the normal bit cell 7. In this example, the same or substantially the same capacitance as the normal bit cell 7 is attained by making the structure of each of the structural dummy bit cells 3 and timing dummy bit cells 5 equal to the structure of the normal bit cell 7.

A first dummy word line DWL1 is arranged on the first row (Row1), a second dummy word line DWL2 is arranged on the second row (Row2) and normal word lines WL (WL1 to WLx-2) are arranged on the other rows (Row3 to Rowx). The first dummy word line DWL1 is electrically connected to the structural dummy bit cells 3 and the second dummy word line DWL2 is electrically connected to the structural dummy bit cells 3 and timing dummy bit cells 5. The normal word lines WL are electrically connected to the normal bit cells 7.

Both ends of the first dummy word line DWL1 are respectively connected to both ends of the second dummy word line DWL2 via connection wirings 4 and thus the second dummy word line DWL2 is connected in parallel with the first dummy word line DWL1 (refer to FIG. 2). The structure is hereinafter adequately referred to as a "parallel-connected dummy word line DWL1/DWL2". As an example of the connection wiring 4, a conductive layer which is used to from the first dummy word line DWL1 and second dummy word line DWL2 is used. As shown in FIG. 2, it can be formed of a ring-form pattern. Further, it can be formed of wiring layers which connect the first dummy word line DWL1 to the second dummy word line DWL2 via contacts by using a conductive layer which is different from a conductive layer used to from the first dummy word line DWL1 and second dummy word line DWL2.

One end of the parallel-connected dummy word line DWL1/DWL2 is connected to a dummy word line driver 11 and one end of each of the normal word lines WL is connected to a corresponding one of normal word line drivers 13 (refer to FIG. 3). For example, the normal word line driver 13 drives a selected normal word line WL among the normal word lines WL1 to WLx based on an output from a row decoder (not shown). If the normal word line WL is driven, data items stored in the normal bit cells 7 which are electrically connected to the driven normal word line WL are read out to the bit lines BL (BL1 to BLk).

For example, the dummy word line driver 11 drives the parallel-connected dummy word line DWL1/DWL2 each time the memory cell array 1 is accessed. When the parallel-connected dummy word line DWL1/DWL2 is driven, for example, a timing trigger signal Strgg indicating that the memory cell array 1 is accessed is output to a dummy bit line DBL from the timing dummy bit cell 5. The dummy bit line DBL is electrically connected to a plurality of timing dummy bit cells 5. The timing trigger signal Strgg is input to an operation timing control circuit 15 via the dummy bit line DBL. The operation timing control circuit 15 controls the data read timing. For example, the operation timing control circuit 15 of this example outputs a timing control signal Scont which controls timing at which data read out to the bit lines BL1 to BLk is read into a memory peripheral circuit based on the timing trigger signal Strgg. In this example, as one circuit example, an example in which the timing control signal Scont is output to sense amplifiers 17 is shown and the timing control signal Scont controls timing to drive the sense amplifiers 17. That is, the operation timing control circuit 15 controls timings to drive a plurality of sense amplifiers 17.

Each of the sense amplifiers 17 is connected to a corresponding one of the normal bit lines BL1 to BLk to amplify data read out to the normal bit lines BL1 to BLk in a differential amplification fashion, for example. The normal bit lines BL1 to BLk are each electrically connected to the plurality of normal bit cells 7. When the timing control signal Scont is set into a state in which driving of the sense amplifiers 17 is enabled, the sense amplifiers 17 are set into the operative state and amplify data items read out to the normal bit lines BL1 to BLk. In this example, the timing at which the sense amplifier 17 is set into the operative state is set to timing after elapse of time defined by the RC time constant of the parallel-connected dummy word line DWL1/DWL2. If the capacitance of the parallel-connected dummy word line DWL1/DWL2 is set equal to or substantially equal to the capacitance of the normal word line WL, the timing at which the sense amplifier 17 is set into the operative state can be set to timing after elapse of time defined by the RC time constant of the normal word line WL. By permitting the timing at which the sense amplifier 17 is set into the operative state to be set to timing after elapse of time defined by the RC time constant of the normal word line WL, the sense amplifier 17 can be suppressed from being set into the operative state before data is read out to the bit lines BL1 to BLk. Thus, the erroneous operation of the device, for example, erroneous data readout operation can be prevented.

Next, one example of the normal bit cells, structural dummy bit cells and timing dummy bit cells is explained.

Figure 4:
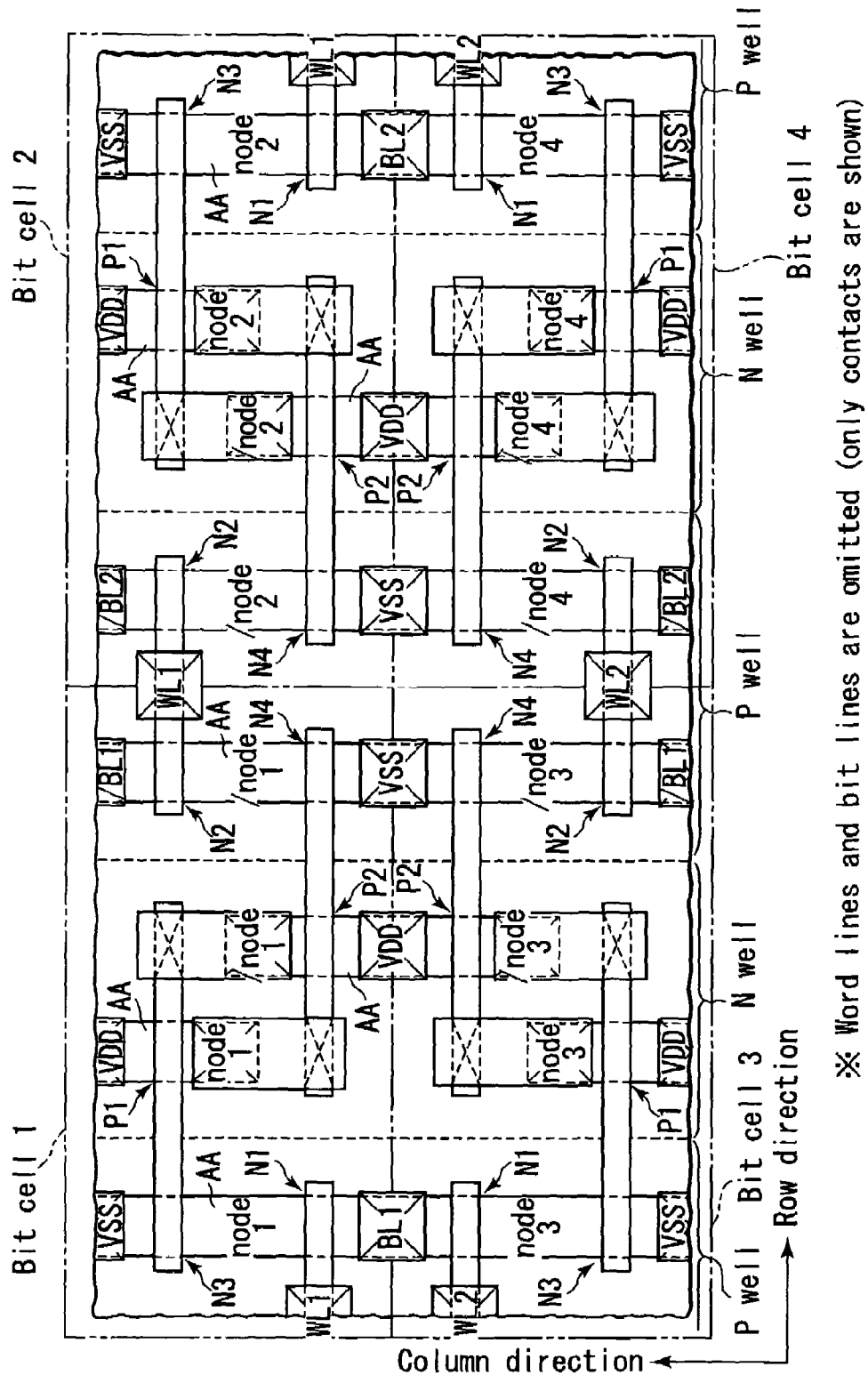
FIG. 4 is a plan view showing one structural example of normal bit cells.
Figure 5:
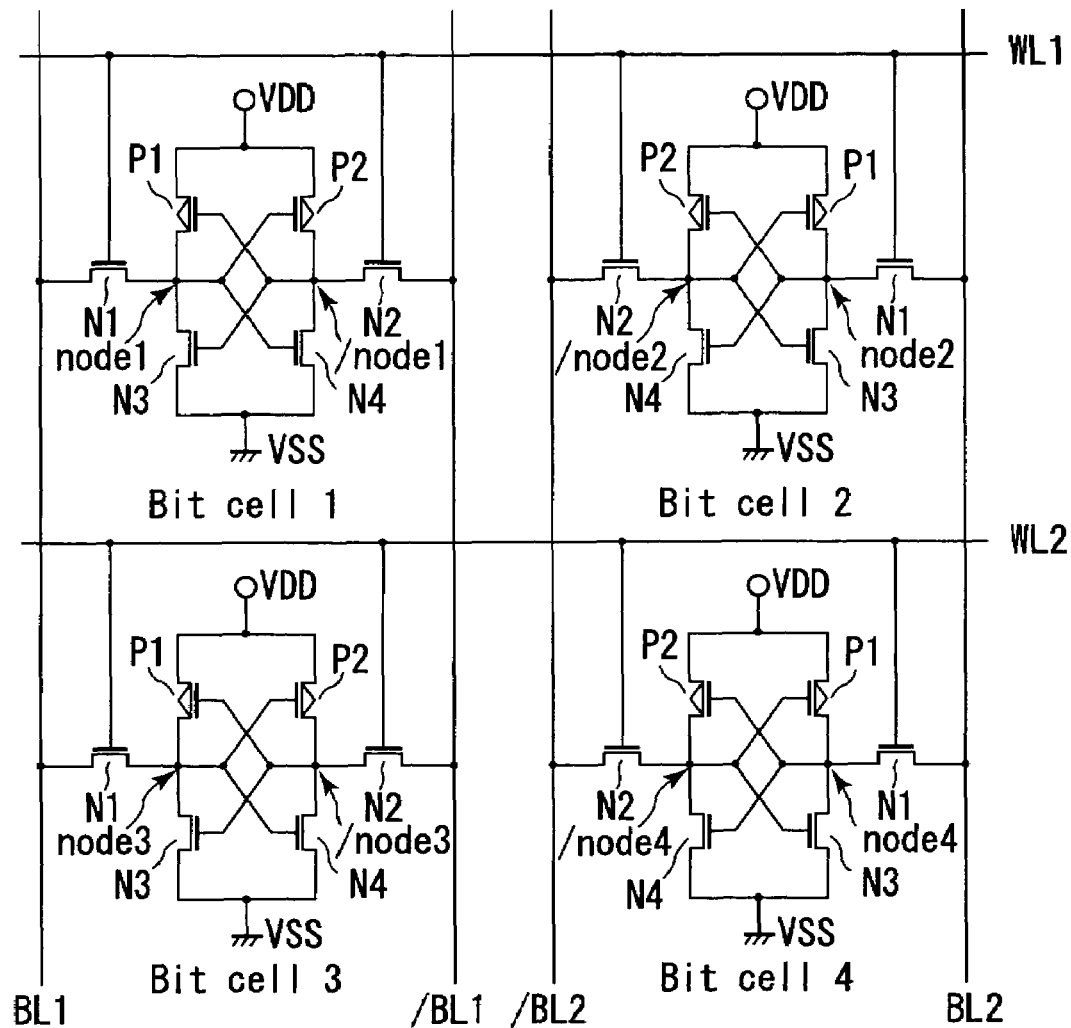
FIG. 5 is an equivalent circuit diagram showing an equivalent circuit of a portion shown in FIG. 4.
Figure 6:
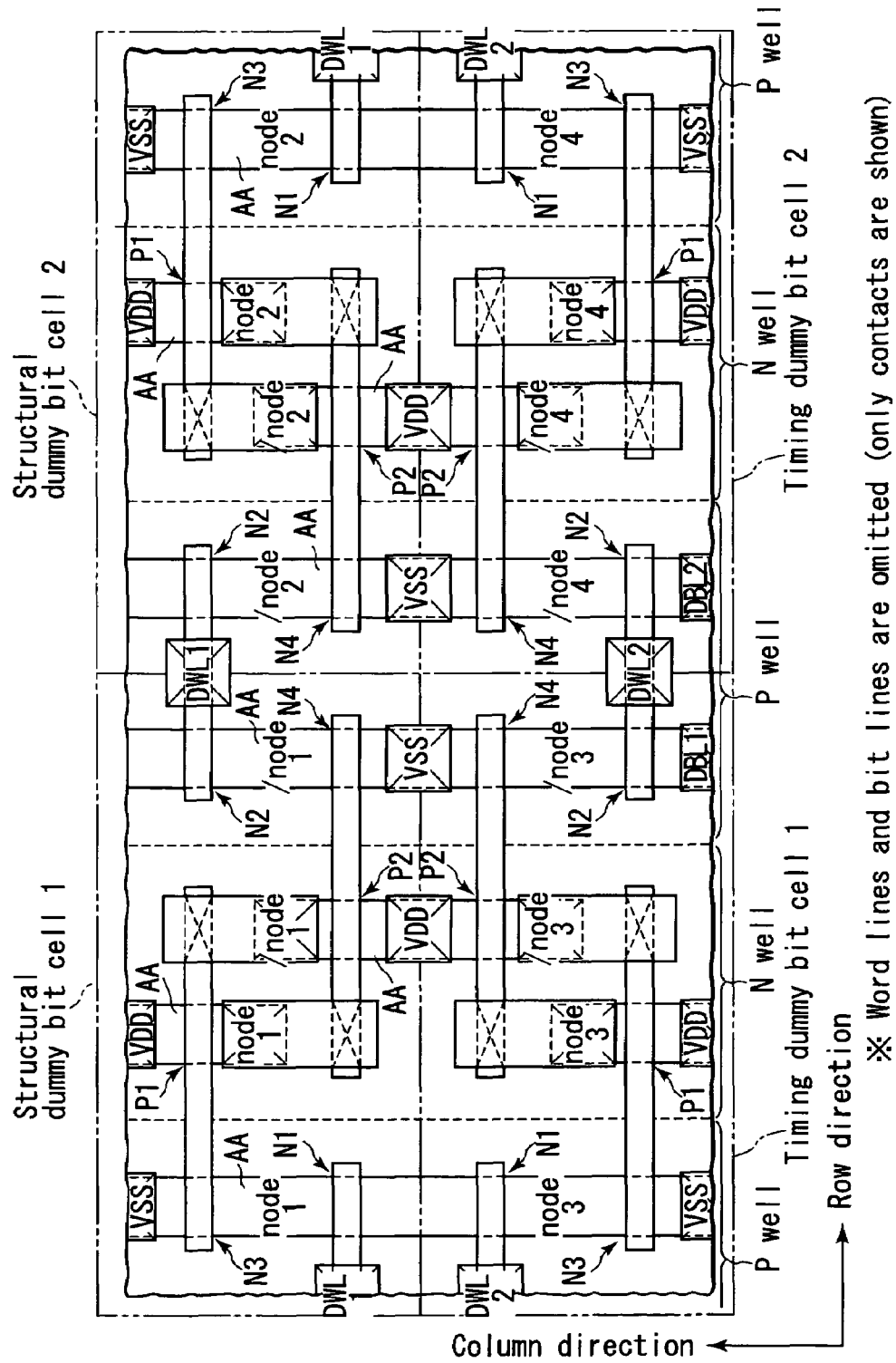
FIG. 6 is a plan view showing one structural example of structural dummy bit cells and timing dummy bit cells.
Figure 7:
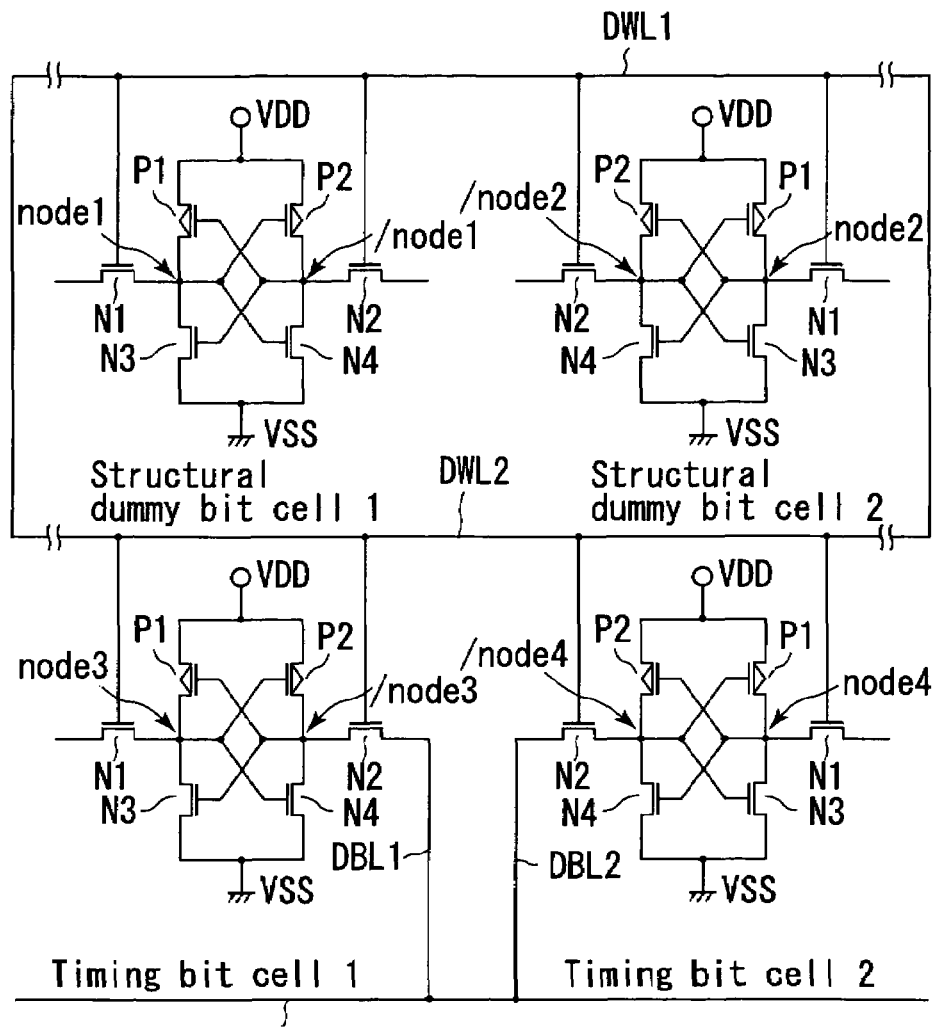
FIG. 7 is an equivalent circuit diagram showing an equivalent circuit of a portion shown in FIG. 6.

FIG. 4 is a plan view showing one structural example of normal bit cells, FIG. 5 is an equivalent circuit diagram showing an equivalent circuit of a portion shown in FIG. 4, FIG. 6 is a plan view showing one structural example of the structural dummy bit cells and timing dummy bit cells, and FIG. 7 is an equivalent circuit diagram showing an equivalent circuit of a portion shown in FIG. 6. FIGS. 4 to 7 show memory cells of an SRAM as one example of the bit cells. In FIGS. 4, 6, for simplifying the drawings, word lines and bit lines are omitted and only contacts are shown.

In FIG. 4, a plane pattern of "two rows×two columns=four normal bit cells (bit cells 1 to 4)" is shown. In the basic layout pattern of the normal bit cells of one example, portions of PMOS transistors (P-channel MOSFETs) P1, P2 of the bit cells shown in the equivalent circuit of FIG. 5 are arranged in a column direction. Further, a portion of NMOS transistors (N-channel MOSFETs) N1, N3 and a portion of NMOS transistors N2, N4 are respectively arranged on both sides of the PMOS transistors P1, P2 in a row direction. In the basic layout pattern, a contact between the drain of N1 and a bit line BL and a contact between the drain of N2 and a complementary bit line /BL are arranged in diagonal positions. The contacts are commonly used by the adjacent normal bit cells arranged in the column direction. Likewise, a contact between the gate of N1 and a word line WL and a contact between the gate of N2 and the word line WL are arranged in diagonal positions. The contacts are commonly used by the adjacent normal bit cells arranged in the row direction. A connection node (storage node: node) of P1, N1 and N3 is connected to a gate pattern of P2, N4 and a connection node (complementary storage node:/node) of P2, N2 and N4 is connected to a gate pattern of P1, N3. This is so-called "cross-coupling connection". The normal bit cells are arranged in the memory cell array 1 by arranging the above basic layout patterns in a line symmetrical form with respect to the positions of the bit line contacts in the column direction and arranging the above basic layout patterns in a line symmetrical form with respect to the positions of the word line contacts in the row direction. In the drawing, "AA" shows the source, drain of the MOSFET and an active region in which the channel is formed and an element isolation region is formed around each of the active regions.

In FIG. 6, a plane pattern of "one row×two columns=two structural dummy bit cells (structural dummy bit cells 1, 2)" and "one row×two columns= two timing dummy bit cells (timing dummy bit cells 1, 2)" is shown. The plane pattern of the structural dummy bit cells and timing dummy bit cells in this example is the same as the plane pattern of the normal bit cells shown in FIG. 4 and the sizes thereof are equal to each other. Thus, for example, the capacitance of the timing dummy bit cell and the capacitance of the structural dummy bit cell electrically connected to the parallel-connected dummy word line DWL1/DWL2 are set approximately equal to the capacitance of the normal bit cell. The difference between them lies in that the normal bit cell is connected to the bit line, the structural dummy bit cell is not connected to the bit line and the timing dummy bit cell is connected to a dummy bit line DBL. When the parallel-connected dummy word line DWL1/DWL2 is driven, the timing dummy bit cell outputs the timing trigger signal Strgg to the dummy bit line DBL, for example. In order to output the timing trigger signal Strgg, it is necessary for the timing dummy bit cell to store certain data. For example, as a method for storing the data, two methods including a method for storing data in a software manner and a method for storing data in a hardware manner are provided. For example, in the case of the method for storing data in the software manner, certain data may be written into the timing dummy bit cell at the power-ON time. In the case of the method for storing data in the hardware manner, complementary potentials may be applied to the storage node (node) and complementary storage node (/node). For example, N3, P2 shown in the equivalent circuit of FIG. 7 are set in the "normally ON" state, low power supply potential VSS is always applied to the storage node (node) and high power supply potential VDD is always applied to the complementary storage node (/node). Thus, when the parallel-connected dummy word line DWL1/DWL2 is driven and both of N1 and N2 are turned "ON", certain data can be output to the dummy bit line DBL.

The structural dummy bit cells and timing dummy bit cells in this example are arranged on the adjacent rows. In this case, one of the storage node (node) and complementary storage node (/node) is commonly used by the structural dummy bit cell and timing dummy bit cell which are adjacent in the column direction. Therefore, one of the storage node (node) and complementary storage node (/node) of the structural dummy bit cell is connected to the dummy bit line DBL. When the dummy bit line DBL is connected to the structural dummy bit cell and if occurrence of an influence on the circuit is predicted, for example, as shown in FIGS. 6 and 7, only one of the storage node (node) and complementary storage node (/node) may be connected to the dummy bit line DBL.

According to the semiconductor integrated circuit device according to the first embodiment, timing at which data is read out into the memory peripheral circuit is controlled by use of the RC time constant of the parallel-connected dummy word line DWL1/DWL2. Therefore, for example, it is possible to suppress occurrence of a state in which the sense amplifier is set into the operative state before data is read out to the bit line. As a result, the erroneous operation of the circuit, for example, the erroneous readout operation can be prevented.

Further, since the dummy word line is used as the parallel-connected dummy word line DWL1/DWL2, for example, the current density for each dummy word line is reduced and the resistance to electromigration can be enhanced in comparison with a case where one dummy word line is used. Unlike the normal word line, the dummy word line is driven each time the semiconductor memory is accessed, the frequency of potential application becomes extremely high in comparison with the case of the normal word line. Therefore, since the resistance to electromigration of the dummy word line is enhanced, the durability of the device can be enhanced and the service life of the device can be made long in comparison with the case where one dummy word line is used.

(Second Embodiment)

The second embodiment is an example relating to a device for making the capacitance of a parallel-connected dummy word line DWL1/DWL2 equal to the capacitance of a normal word line. In the following explanation, "wiring width" is defined as the width of the normal/dummy word line in a column direction and "wiring length" is defined as the length of the normal/dummy word line in a row direction.

Figure 8:
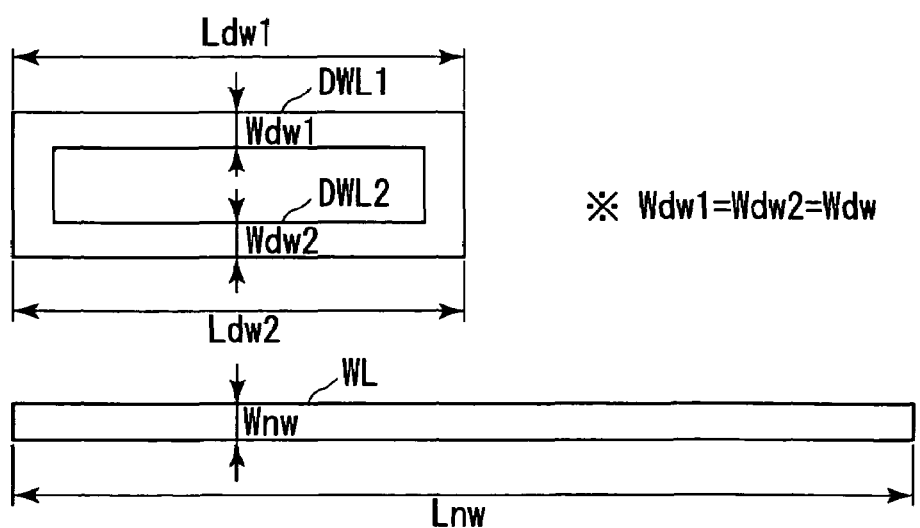
FIG. 8 is a plan view showing a dummy word line and a normal word line used in a semiconductor integrated circuit device according to a second embodiment of this invention.

FIG. 8 is a plan view showing a dummy word line and a normal word line used in a semiconductor integrated circuit device according to the second embodiment of this invention.

As shown in FIG. 8, in the semiconductor integrated circuit device according to the second embodiment, the wiring width Wdw1 of a first dummy word line DWL1 and the wiring width Wdw2 of a first dummy word line DWL2 are set to the wiring width Wdw. Further, the wiring width Wnw of the normal word line WL is set to the wiring width Wdw and thus the wiring widths Wdw1, Wdw2, Wnw are set to the same value.

One advantage of the above configuration is that word lines having fine wiring width can be easily formed with high density. One of the bases is that a variation in the wiring width due to the interference/diffraction of light can be suppressed and word lines having fine wiring width can be formed with high density, for example, at the time of lithography process by equally setting the wiring widths Wdw1, Wdw2, Wnw.

When the wiring widths Wdw1, Wdw2, Wnw are set to the same value, the total wiring length (Ldw1+Ldw2) of the wiring length Ldw1 of the first dummy word line DWL1 and the wiring length Ldw2 of the second dummy word line DWL2 is set equal to the wiring length Lnw of the normal word line WL. By setting the total wiring length (Ldw1+Ldw2) equal to the wiring length Lnw, the wiring capacitance of the parallel-connected dummy word line DWL1/DWL2 can be set substantially equal to the wiring capacitance of the normal word line WL. Therefore, the RC time constant of the parallel-connected dummy word line DWL1/DWL2 can be set closer to the RC time constant of the normal word line WL. Strictly speaking, since two dummy word lines are connected in parallel in the parallel-connected dummy word line DWL1/DWL2, the resultant wiring resistance of the parallel-connected dummy word line DWL1/DWL2 becomes lower in comparison with the wiring resistance of the normal dummy word line WL. For example, when "Wdw1=Wdw2=Wnw, Ldw1=Ldw2=Lnw/2, and a conductor configuring DWL1/DWL2 and a conductor configuring WL" are formed of the same material, the resultant wiring resistance of the parallel-connected dummy word line DWL1/DWL2 becomes equal to ¼ of the wiring resistance of the normal dummy word line WL. However, the wiring capacitance is dominant over the wiring resistance in determining the RC time constant of the word line. Therefore, a difference in the wiring resistance can be neglected in practice and it is practical to uniformly set the wiring capacitances.

(Third Embodiment)

Like the second embodiment, the third embodiment is an example relating to a device for setting the capacitance of a parallel-connected dummy word line DWL1/DWL2 equal to the capacitance of a normal word line WL.

In the second embodiment, particularly, the wiring capacitance of the parallel-connected dummy word line DWL1/DWL2 is set substantially equal to the wiring capacitance of the normal word line WL. On the other hand, the third embodiment is an example in which, particularly, parasitic capacitance associated with the parallel-connected dummy word line DWL1/DWL2 is set substantially equal to parasitic capacitance associated with the normal word line WL.

Figure 9:
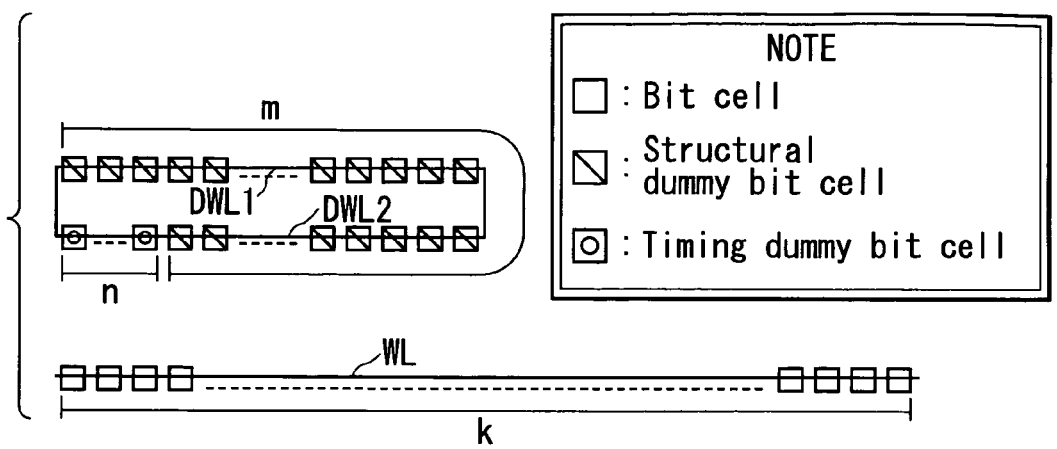
FIG. 9 is a plan view showing a dummy word line and a normal word line used in a semiconductor integrated circuit device according to a third embodiment of this invention.

FIG. 9 is a plan view showing a dummy word line and a normal word line used in a semiconductor integrated circuit device according to the third embodiment of this invention.

As shown in FIG. 9, in the semiconductor integrated circuit device according to the third embodiment, for example, the structure of the structural dummy bit cell, the structure of the timing dummy bit cell and the structure of the normal bit cell are set equal to one another as explained in the first embodiment. Thus, the capacitance of each bit cell can be set equal to the same value.

One of the advantages attained by the above configuration is that the bit cells can be easily formed with high density in one memory cell array 1 according to the same basis as that of the second embodiment since the structural dummy bit cell, timing dummy bit cell and normal bit cell are formed with the same structure.

Further, the total number (m+n) of the number m of structural dummy bit cells and the number n of timing dummy bit cells which are electrically connected to the first dummy word line DWL1 and the second dummy word line DWL2 is set equal to the number k of normal bit cells electrically connected to the normal word line WL. By setting the total number (m+n) equal to the number k of normal bit cells, parasitic capacitance associated with the parallel-connected dummy word line DWL1/DWL2 can be set substantially equal to parasitic capacitance associated with the normal word line WL.

Further, in the third embodiment, particularly, the plane patterns of the structural dummy bit cell, timing dummy bit cell and normal bit cell are set equal to one another. By thus forming the plane patterns equal to one another, the following advantage can be attained when the number of parallel-connected dummy word lines is set to "2", for example. That is, the wiring length Ldw1 of the first dummy word line DWL1 and the wiring length Ldw2 of the second dummy word line DWL2 are automatically set to ½ of the wiring length Lnw of the normal word line WL and the total wiring length (Ldw1+Ldw2) is automatically set to the wiring length Lnw.

(Fourth Embodiment)

Figure 10:
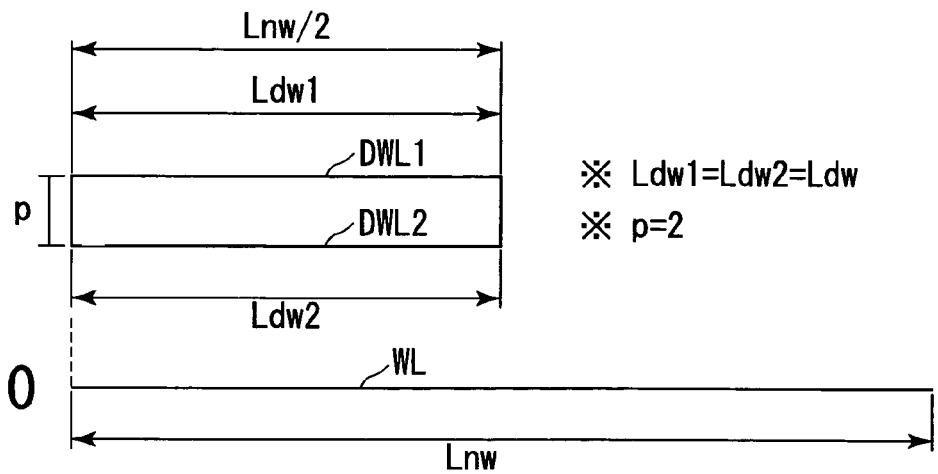
FIG. 10 is a diagram showing the relation between the wiring lengths of the dummy word lines and the normal word line used in each of the semiconductor integrated circuit devices according to the first to third embodiments of this invention.

As shown in FIG. 10, the number p of parallel connections (or parallel-connected dummy word lines) is set to "2" in the first to third embodiments. In the case of "p=2", in order to set the wiring capacitance of the parallel-connected dummy word line DWL1/DWL2 substantially equal to the wiring capacitance of the normal word line WL, for example, the wiring lengths Ldw1, Ldw2 may be set to Ldw=½ of the wiring length Lnw (where Ldw1=Ldw2=Ldw).

However, from the viewpoint that the resistance to electromigration is enhanced, the number p of parallel-connected dummy word lines is not limited to "p=2" and can be set to any number if it is "p≧2".

The fourth embodiment is an example in which the wiring capacitance of the parallel-connected dummy word line DWL1/DWL2 is set substantially equal to the wiring capacitance of the normal word line WL, particularly, in the case of "p≧2".

Figure 11:
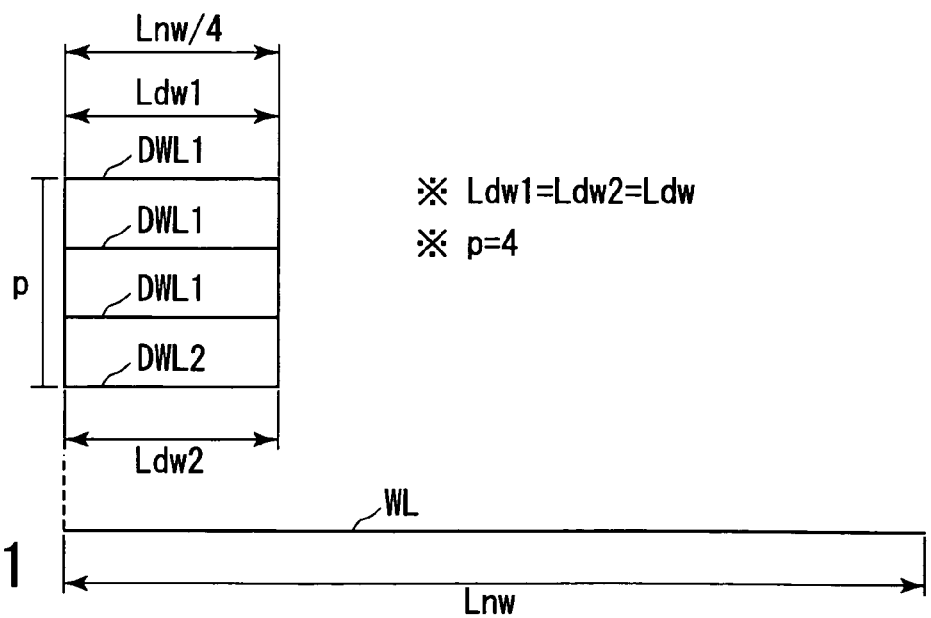
FIG. 11 is a diagram showing the relation between the wiring lengths of dummy word lines and a normal word line used in a semiconductor integrated circuit device according to a fourth embodiment of this invention.

FIG. 11 is a diagram showing the relation between the wiring lengths of the dummy word lines and the wiring length of the normal word line used in a semiconductor integrated circuit device according to the fourth embodiment of this invention.

As shown in FIG. 11, in a case where the number p of parallel-connected dummy word lines is set to "4", for example, the wiring lengths Ldw1, Ldw2 may be set to Ldw=¼ of the wiring length Lnw (where Ldw1=Ldw2=Ldw). When the example is generalized, the wiring length Ldw of the first dummy word line DWL1 and second dummy word line DWL2 is set to Ldw=1/p of the wiring length Lnw of the normal word line (where p is the number of parallel-connected dummy word lines and is a natural number equal to or larger than "2").

By maintaining the above relation, the wiring capacitance of the parallel-connected dummy word line DWL1/DWL2 can be set substantially equal to the wiring capacitance of the normal word line WL when the number p of parallel-connected dummy word lines is to "p≧2".

(Fifth Embodiment)

The fifth embodiment is an example relating to a device of a wiring which connects the output of a dummy word line driver to a parallel-connected dummy word line DWL1/DWL2.

An output terminal 23 of the dummy word line driver may be directly connected to one end 25 of the parallel-connected dummy word line DWL1/DWL2 in some cases. However, the output terminal 23 may be connected to one end 25 via a wiring (which is referred to as a driving wiring in this specification) 21 in other cases. Further, like the parallel-connected dummy word line DWL1/DWL2, the driving wiring 21 may be laid out in an IC chip as a parallel-connected driving wiring 21 in some cases. However, it is laid out in an IC chip as a single driving wiring 21 in some cases. One concrete example is shown in FIG. 12.

Figure 12:
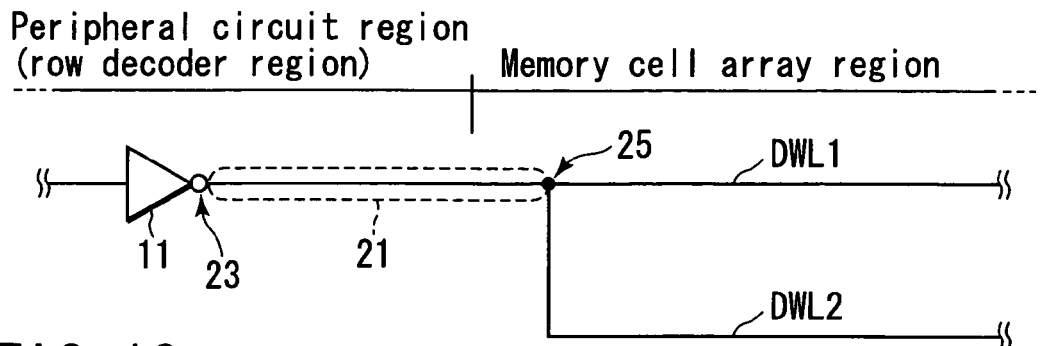
FIG. 12 is a diagram showing one example of the connection relation between a dummy word line driver and parallel-connected dummy word lines.

As shown in FIG. 12, for example, the parallel-connected dummy word line DWL1/DWL2 is laid out in a memory cell array region of the IC chip and the single driving wiring 21 is laid out in a peripheral circuit region, for example, row decoder region of the IC chip, for example. When the single driving wiring 21 is laid out in the IC chip, it is favorable to take the electromigration resistance into consideration in the driving wiring 21. This is because the electrical connection between the dummy word line driver 11 and the parallel-connected dummy word line DWL1/DWL2 is broken when the driving wiring 21 causes electromigration.

Figure 13:
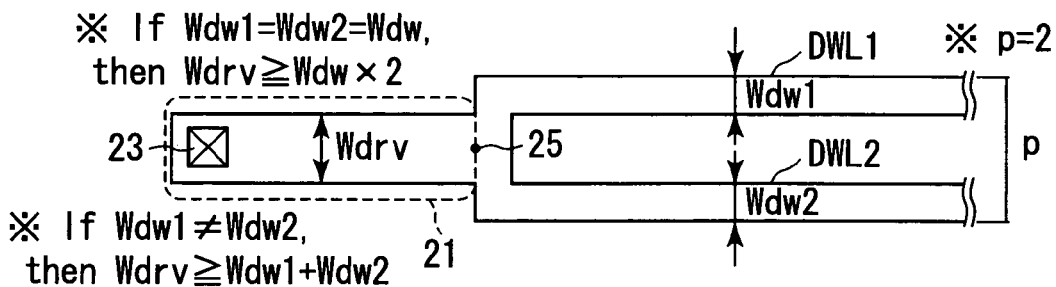
FIG. 13 is a plan view showing a first example of a driving wiring which a semiconductor integrated circuit device according to a fifth embodiment of this invention has.

FIG. 13 is a plan view showing a first example of a driving wiring which a semiconductor integrated circuit device according to the fifth embodiment of this invention has.

As shown in FIG. 13, the output terminal 23 of the dummy word line driver is connected to the single driving wiring 21 which is in turn connected to one end 25 of the parallel-connected dummy word line DWL1/DWL2. In this example, the number p of parallel connections of the parallel-connected dummy word line DWL1/DWL2 is set to "2" and the wiring width Wdw1 of the first dummy word line DWL1 is set equal to the wiring width Wdw2 of the second dummy word line DWL2 to set up the relation of "Wdw1=Wdw2=Wdw". In this case, the wiring width Wdrv of the driving wiring 21 is set to "Wdrv≧Wdw×2".

According to the fifth embodiment, by setting the wiring width Wdrv of the driving wiring 21 larger then the wiring width Wdw, for example, by setting "Wdrv≧Wdw×2", the electromigration resistance of the driving wiring 21 can be enhanced. The durability of the device can be enhanced and the service life of the device-can be made long by having the parallel-connected dummy word line DWL1/DWL2 and the driving wiring 21 whose electromigration resistance is enhanced.

In this example, a case wherein the relation of "Wdw1=Wdw2=Wdw" is set up is assumed, but in a case of "Wdw1≠Wdw2", the wiring width Wdrv of the driving wiring 21 may be set to "Wdrv≧Wdw1+Wdw2". "Wdw1+Wdw2" is the total value of the wiring width of the first dummy word line DWL1 and the wiring width of the second dummy word line DWL2.

Figure 14:
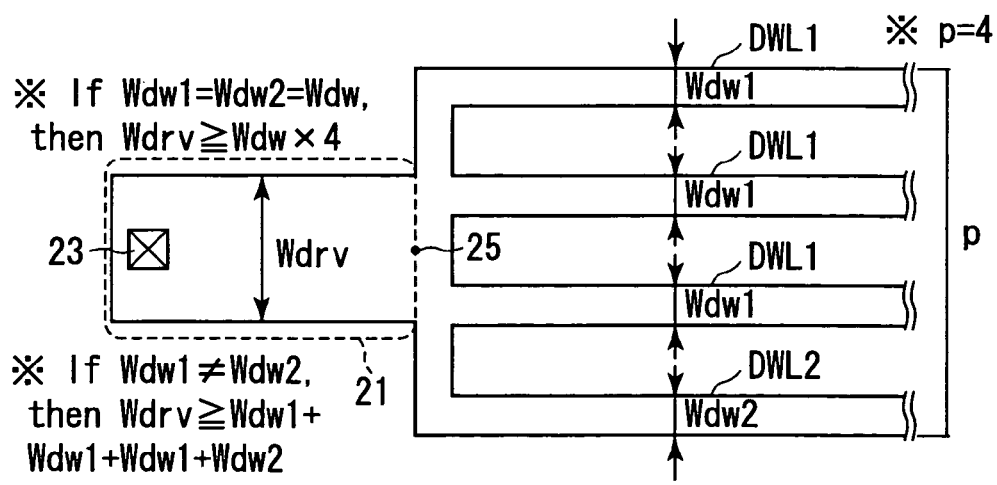
FIG. 14 is a plan view showing a second example of the driving wiring which the semiconductor integrated circuit device according to the fifth embodiment of this invention has.

FIG. 14 is a plan view showing a second example of the driving wiring which the semiconductor integrated circuit device according to the fifth embodiment of this invention has.

As shown in FIG. 14, in a case where the number p of parallel connections of the parallel-connected dummy word line DWL1/DWL2 is set to "4", the same advantage as that of the first example can be attained by setting the wiring width Wdrv of the driving wiring 21 to "Wdrv≧Wdw×4".

In this example, a case wherein the relation of "Wdw1=Wdw2=Wdw" is set up is assumed, but in a case of "Wdw1≠Wdw2", the wiring width Wdrv of the driving wiring 21 may be set to "Wdrv≧Wdw1+Wdw1+Wdw1+Wdw2".

When the first and second examples are generalized and if the wiring width of each of the first dummy word line DWL1 and second dummy word line DWL2 is set to Wdw, the wiring width Wdrv of the driving wiring 21 is set to "Wdrv≧Wdw×p" (where p is the number of parallel-connected dummy word lines and is a natural number equal to or larger than "2").

When the total value of the wiring width of the first dummy word line DWL1 and the wiring width of the second dummy word line DWL2 is set to Wdwall, the wiring width Wdrv of the driving wiring 21 is set to "Wdrv≧Wdwall".

(Sixth Embodiment)

FIG. 15 is a plan view showing a semiconductor integrated circuit device according to a sixth embodiment of this invention.

As shown in FIG. 15, the semiconductor integrated circuit device according to the sixth embodiment is different from the semiconductor integrated circuit device according to the first embodiment in that a parallel-connected dummy word line DWL1/DWL2 is formed in a folded word line configuration.

The representative advantage of the sixth embodiment is explained below.

FIG. 16 is a diagram showing the relation between the parallel-connected dummy word line DWL1/DWL2 and timing dummy bit cells.

As shown in FIG. 16, it is favorable that at least one timing dummy bit cell 5 is arranged on the peripheral circuit region side, for example, on the dummy word line driver 11 side of the IC chip of the memory cell array. By arranging the timing dummy bit cell 5 on the peripheral circuit region side, the wiring length of a dummy bit line DBL which connects the timing dummy bit cell 5 to the operation timing control circuit arranged in the peripheral circuit region can be suppressed from being uselessly increased.

However, when the timing dummy bit cell 5 is arranged on the peripheral circuit region side, the timing dummy bit cell 5 will be disposed near one end 25 of the parallel-connected dummy word line DWL1/DWL2. The one end 25 is a portion in which the output terminal 23 of the dummy word line driver 11 or the driving wiring 21 is connected. The one end 25 is connected to the connection wiring 4 shown in FIG. 2. As shown in FIG. 2, the wiring length Lc1 of the connection wiring 4 is shorter than the wiring length Ldw of the first dummy word line DWL1 and second dummy word line DWL2. For example, several thousand or more memory cells are connected to the first dummy word line DWL1 and second dummy word line DWL2 in the row direction. Therefore, the wiring length Ldw is set to a value on the order of several mm in some cases, for example. The connection wiring 4 connects the first dummy word line DWL1 to the second dummy word line DWL2 in the column direction, for example. The first dummy word line DWL1 and second dummy word line DWL2 are arranged on the adjacent rows, for example. Therefore, for example, the wiring length Lc1 is generally set on the order of several μm or shorter. Thus, there occurs a possibility that both of the resistance and capacitance of a portion (which is hereinafter referred to as a proximity end) 31 of the connection wiring 4 which is connected to the one end 25 will become small. It is assumed that the timing dummy bit cell 5 is connected to a portion near the proximity end 31 which causes the above situation. On this assumption, a state substantially equivalent to the state in which the timing dummy bit cell 5 is connected to the one end 25 of the parallel-connected dummy word line DWL1/DWL2 is attained. Putting it in the most extreme terms, substantially the equivalent state in which it is connected to the driving wiring 21 is attained. In the above circuit, the timing dummy bit cell 5 is turned ON substantially at the same time as the parallel-connected dummy word line DWL1/DWL2 is driven and it outputs a timing trigger signal to the dummy bit line DBL. That is, the delay time due to the parallel-connected dummy word line DWL1/DWL2 cannot be reflected on the output of the timing trigger signal.

As one of the methods for solving the above situation, a method for connecting the timing dummy bit cell 5 to a portion near a portion (which is hereinafter referred to as a far-away end) 33 of the connecting portion 4 which is farthest from the one end 25 of the parallel-connected dummy word line DWL1/DWL2 may be provided. However, if the timing dummy bit cell 5 is connected to the portion near the far-away end 33, for example, the wiring length of the dummy bit line DBL is uselessly increased. Delay of the RC time constant of the dummy bit line DBL occurs until the timing trigger signal output from the timing dummy bit cell 5 reaches the operation timing control circuit. If the wiring length of the dummy bit line DBL is increased, the RC time constant of the dummy bit line DBL is also increased and time for outputting a timing control signal is delayed. If the timing control signal is not output, for example, the sense amplifier 17 is not operated. Therefore, if output timing of the timing control signal is uselessly delayed, a disadvantage will occur in some cases when the device operation is enhanced.

Therefore, as shown in FIG. 16, the parallel-connected dummy word line DWL1/DWL2 is folded on halfway to make a folded word line configuration. That is, the parallel-connected dummy word line DWL1/DWL2 including a first dummy word line DWL1 and a second dummy word line DWL2 connected in parallel with the first dummy word line DWL1 acts as a folded word line.

One example of the folded position is a position of the wiring length Ldw/2. Further, in the sixth embodiment, the parallel-connected dummy word line DWL1/DWL2 is formed in a folded bit line configuration and the timing dummy bit cell 5 is connected to a portion near the far-away end 33 of the parallel-connected dummy word line DWL1/DWL2. With this configuration, the timing dummy bit cell 5 is turned ON when time defined by the RC time constant of the parallel-connected dummy word line DWL1/DWL2 has elapsed after the parallel-connected dummy word line DWL1/DWL2 was driven and outputs a timing trigger signal to the dummy bit line DBL. Thus, the delay time by the parallel-connected dummy word line DWL1/DWL2 can be reflected on the output of the timing trigger signal.

Further, by forming the parallel-connected dummy word line DWL1/DWL2 in a folded word line configuration, the timing dummy bit cell 5 connected to the faraway end 33 can be arranged on the peripheral circuit region side, for example, the dummy word line driver 11 side of the IC chip of the memory cell array. Therefore, the wiring length of the dummy bit line DBL can be suppressed from being uselessly increased. For example, output timing of the timing control signal output from the operation timing control circuit can be suppressed from being uselessly delayed. As a result, an advantage that it is advantageous for enhancing the operation speed of the device can be attained.

Next, one example of the folded position of the parallel-connected dummy word line DWL1/DWL2 of the semiconductor integrated circuit device according to the sixth embodiment is explained.

In the sixth embodiment, it is assumed that the number p of parallel-connected dummy word lines is set to "2". In the case of "p=2", the parallel-connected dummy word line DWL1/DWL2 is folded in the position of the wiring length Ldw/2, for example, in the row direction. For example, in the fourth embodiment, the wiring length Ldw is set to "Ldw=Lnw/2". Therefore, when the fourth embodiment is applied to the sixth embodiment, the folded position is set in a position corresponding to ¼ of the wiring length Lnw of the normal word line WL as shown in FIG. 17 in order to make the wiring capacitance of the parallel-connected dummy word line DWL1/DWL2 approximately equal to the wiring capacitance of the normal word line WL.

Further, as shown in FIG. 18, in the case of "p=4", the parallel-connected dummy word line DWL1/DWL2 is folded in the position of the wiring length Ldw/4, for example, in the row direction. For example, in the fourth embodiment, the wiring length Ldw is set to "Ldw=Lnw/4". Therefore, in the case of "p=4", the folded position is set in a position corresponding to ⅛ of the wiring length Lnw of the normal word line WL.

When the present example is generalized, the folded position of the parallel-connected dummy word line DWL1/DWL2 is set to 1/(p×2) with respect to the wiring length Lnw of the normal word line. That is, the folded position of the parallel-connected dummy word line DWL1/DWL2 is set to "Lnw=1/(p×2)" (where Lnw denotes the wiring length of the normal word line and p denotes the number of parallel-connected dummy word lines and is a natural number set to "2" or more).

(Seventh Embodiment)

The seventh embodiment is an example relating to the arrangement of a parallel-connected dummy word line.

Figure 19:
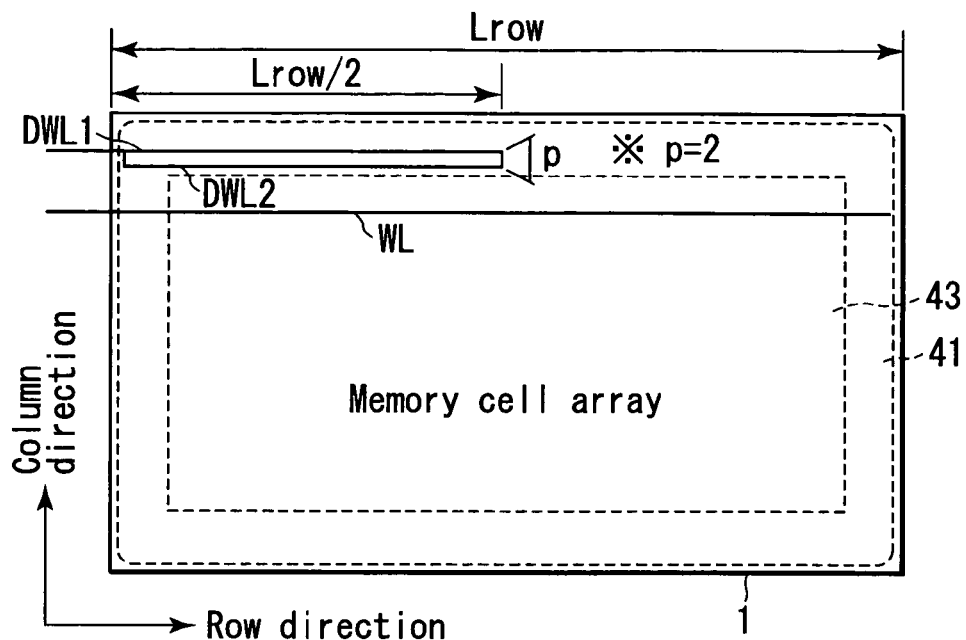
FIG. 19 is a plan view showing a first example of a semiconductor integrated circuit device according to a seventh embodiment of this invention.

FIG. 19 is a plan view showing a first example of a semiconductor integrated circuit device according to a seventh embodiment of this invention.

As shown in FIG. 19, it is favorable that a parallel-connected dummy word line DWL1/DWL2 is arranged in a peripheral portion 41 of a memory cell array 1 and normal word lines WL are arranged in a central portion 43 of the memory cell array 1. That is, it is favorable that a plurality of structural dummy bit cells 3 and a plurality of timing dummy bit cells 5 are arranged in the peripheral portion 41 of the memory cell array 1 and a plurality of normal bit cells 7 are arranged in the central portion 43 of the memory cell array 1.

A representative advantage in the seventh embodiment is explained below.

As shown in FIG. 19, for example, a dummy pattern is arranged in the peripheral portion 41 in order to form a fine pattern on the central portion 43 with high precision. For example, a dummy word line pattern and dummy bit line pattern are formed. A word line pattern and bit line pattern are typical examples of a pattern which is generally called a line-and-space pattern. For example, in the case of the line-and-space pattern, it cannot be simply said that the dimensional precision of the pattern is enhanced in the central portion since it depends on the pattern size, the performance of the exposure device and the precision of the photomask. However, a phenomenon that the dimensional precision of the pattern is enhanced is observed. Therefore, a pattern lying only in the central portion and having high dimensional precision is used in some cases without using a pattern lying in the peripheral portion. If normal bit cells are formed by use of the pattern with high dimensional precision, for example, a variation in the RC time constant of the normal word line and a variation in the RC time constant of the normal bit line can be suppressed within a narrow range. As a result, for example, an advantage that it is advantageous for enhancing the operation speed of the device can be attained.

The pattern which is not used is generally left behind in the IC chip. The remaining pattern is generally called a dummy pattern. In this example, an area in which the dummy pattern is left behind is used as the peripheral portion 41 shown in FIG. 19. Further, the parallel-connected dummy word line DWL1/DWL2 is arranged in the peripheral portion 41 in which the dummy pattern is left behind. Since the dummy pattern is left behind on the peripheral portion 41, a space demerit does not occur if the parallel-connected dummy word line DWL1/DWL2 is arranged in the peripheral portion 41. Therefore, an advantage that the chip size does not uselessly increase.

In this case, a plurality of normal bit cells, a plurality of structural dummy bit cells and a plurality of timing dummy bit cells are integrated on a single memory cell array 1. A plurality of normal bit cells are arranged in the central portion 43 of the memory cell array 1 and a plurality of structural dummy bit cells and a plurality of timing dummy bit cells are arranged in the peripheral portion 41 of the memory cell array 1.

The dimensional precision of the pattern in the peripheral portion 41 is lower than the dimensional precision of the pattern in the central portion 43. However, the dimensional precision of the pattern in a portion of the peripheral portion 41 which is adjacent to the central portion 43 is approximately equal to the dimensional precision of the pattern in the central portion 43. Therefore, it is desirable to form a parallel-connected dummy word line DWL1/DWL2 by use of the dummy pattern formed on a portion of the peripheral portion 41 which is adjacent to the central portion 43.

More specifically, the number p of parallel connections of the parallel-connected dummy word line is set to two to a dozen or so in practice. If the dimensional precision of the pattern lying in position of approximately a dozen or so when counting from the end of the central portion 43 is used, it is practically sufficient. Therefore, it is favorable to form the parallel-connected dummy word line DWL1/DWL2 by use of a pattern with lines of up to a dozen or so when counting from the end of the central portion 43, for example, when counting from the normal word line WL at the end. This case is only an example and is not limitative.

An example in which the wiring length of the parallel-connected dummy word line DWL1/DWL2 is defined by the length Lrow in the row direction of the memory cell array 1 is shown in FIG. 19. By setting the wiring length of the parallel-connected dummy word line DWL1/DWL2 to Lrow/2, the wiring capacitance of the parallel-connected dummy word line DWL1/DWL2 can be made approximately equal to the wiring capacitance of the normal word line WL.

Figure 20:
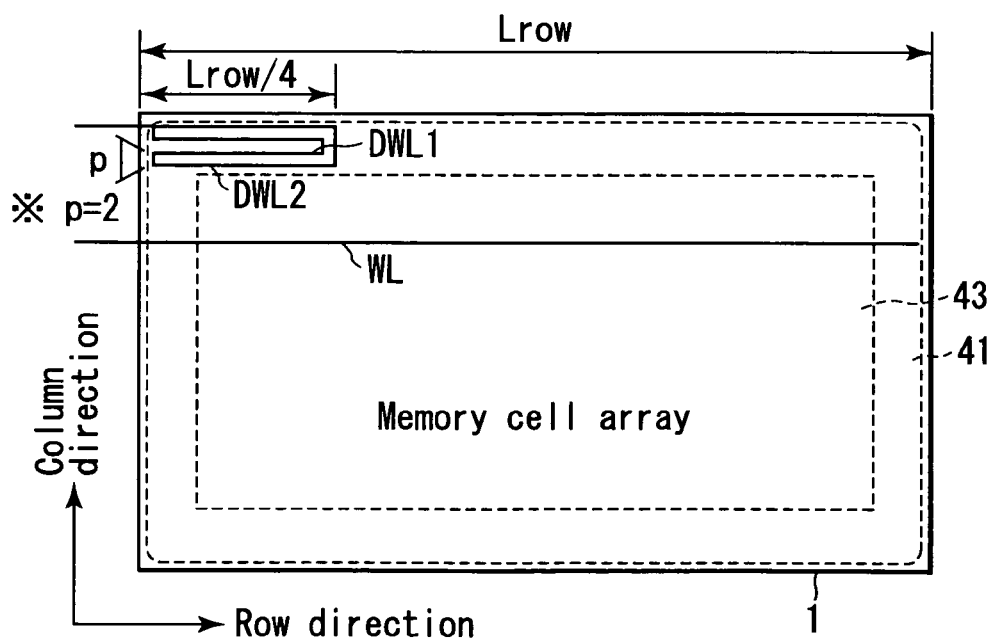
FIG. 20 is a plan view showing a second example of the semiconductor integrated circuit device according to the seventh embodiment of this invention.

FIG. 20 is a plan view showing a second example of the semiconductor integrated circuit device according to the seventh embodiment of this invention.

As shown in FIG. 20, the device of the second example is different from the device of the first example shown in FIG. 19 in that the parallel-connected dummy word line DWL1/DWL2 is formed in a folded word line configuration.

As shown in the second example, the parallel-connected dummy word line DWL1/DWL2 can be arranged in the peripheral portion 41 in a case where it is formed in the folded word line configuration.

Further, an example in which the folded position set when the parallel-connected dummy word line DWL1/DWL2 is formed in the folded word line configuration is defined by the length Lrow in the row direction of the memory cell array 1 is shown in FIG. 20. By setting the folded position of the parallel-connected dummy word line DWL1/DWL2 to Lrow/4, the wiring capacitance of the parallel-connected dummy word line DWL1/DWL2 can be made approximately equal to the wiring capacitance of the normal word line WL.

Figure 21:
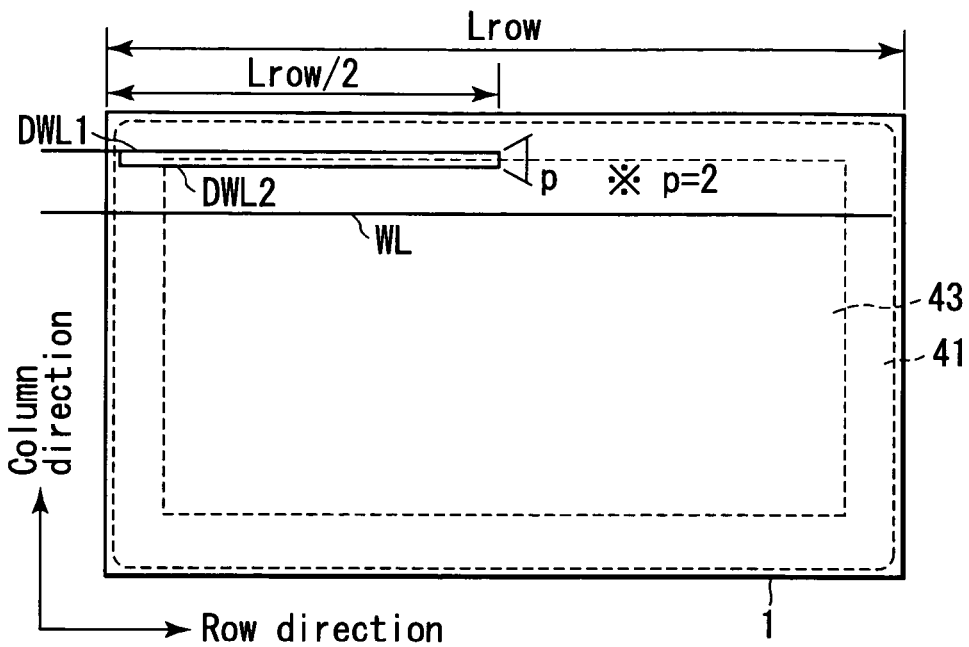
FIG. 21 is a plan view showing a third example of the semiconductor integrated circuit device according to the seventh embodiment of this invention.

FIG. 21 is a plan view showing a third example of the semiconductor integrated circuit device according to the seventh embodiment of this invention.

As shown in FIG. 21, the device of the third example is different from the device of the first example shown in FIG. 19 in that part of the parallel-connected dummy word line DWL1/DWL2, for example, a second dummy word line DWL2 to which timing dummy bit cells are connected is arranged in the central portion 43. Thus, it is of course possible to arrange part or all of the parallel-connected dummy word line DWL1/DWL2 in the central portion 43.

Figure 22:
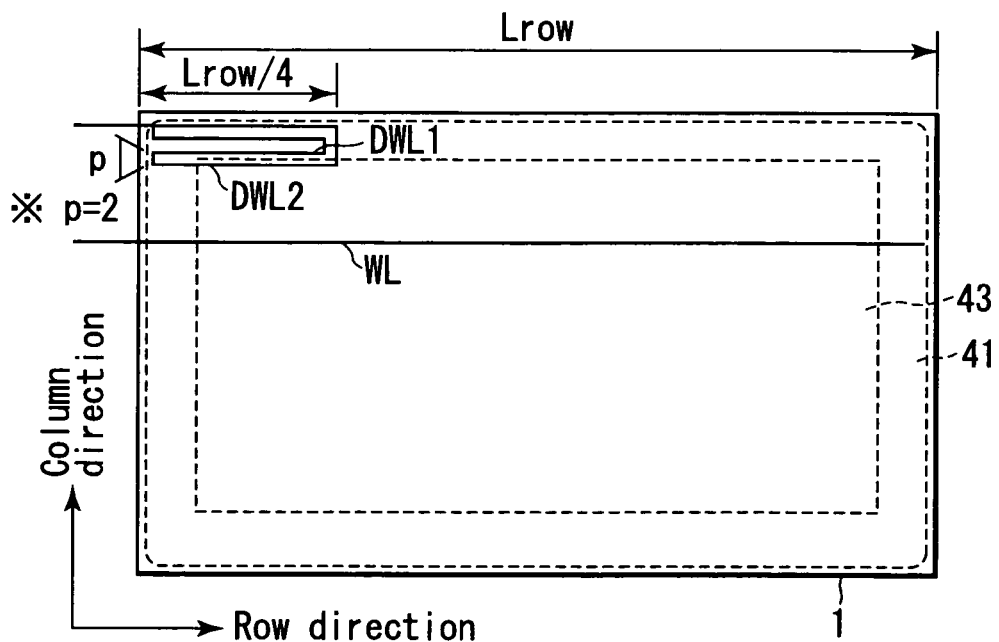
FIG. 22 is a plan view showing a fourth example of the semiconductor integrated circuit device according to the seventh embodiment of this invention.

FIG. 22 is a plan view showing a fourth example of the semiconductor integrated circuit device according to the seventh embodiment of this invention.

As shown in FIG. 22, the device of the fourth example is different from the device of the third example shown in FIG. 21 in that the parallel-connected dummy word line DWL1/DWL2 is formed in a folded word line configuration.

As shown in the fourth example, when the parallel-connected dummy word line DWL1/DWL2 is formed in the folded word line configuration, part or all of the parallel-connected dummy word line DWL1/DWL2 is arranged in the central portion 43.

This invention has been explained with reference to the embodiments. However, the present invention is not limited to the above embodiments and can be variously modified without departing from the technical scope thereof when embodying the present invention. For example, the SRAM memory cell is used as an example of the memory cell, but the device according to the embodiments of this invention can be applied to a semiconductor memory other than the SRAM.

Further, the above embodiments can be independently performed, but it is of course possible to adequately combine and perform the embodiments.

Inventions of various stages are contained in the embodiments and the inventions of various stages can be extracted by adequately combining a plurality of constituents disclosed in the respective embodiments.

In the above embodiments, this invention is explained based on an example in which this invention is applied to the semiconductor integrated circuit device, for example, semiconductor memory. However, a semiconductor integrated circuit device containing the above semiconductor memory, for example, a processor, system LSI or the like can be contained in the scope of this invention.

As described above, according to the above embodiments, a semiconductor integrated circuit device having dummy word lines which can extend the service life of the device can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a plurality of normal bit cells;
   a plurality of structural dummy bit cells having the same structure as that of the plurality of normal bit cells;
   a plurality of timing dummy bit cells having the same structure as that of the plurality of normal bit cells;
   normal word lines electrically coupled to the plurality of normal bit cells;
   a first dummy word line electrically coupled to the plurality of structural dummy bit cells; and
   a second dummy word line electrically coupled to the plurality of timing dummy bit cells and connected in parallel with the first dummy word line,
   wherein wiring widths of the first dummy word line, second dummy word line and normal word line are set equal to one another and total wiring length of wiring lengths of the first dummy word line and second dummy word line is set equal to wiring length of the normal word line.

2. The device according to claim 1, wherein a total number of the numbers of the plurality of structural dummy bit cells and the plurality of timing dummy bit cells which are electrically coupled to the first and second dummy word lines is set equal to a total number of normal bit cells electrically coupled to the normal word line.

3. The device according to claim 1, further comprising a dummy word line driver which drives the first dummy word line and the second dummy word line connected in parallel with the first dummy word line; wherein wiring width Wdrv of a driving wiring which electrically connects an output of the dummy word line driver to an interconnection node of the first and second dummy word lines is set to satisfy the relation of Wdrv≧Wdw×p (where p denotes the number of parallel connections and is a natural number not smaller than 2) when the wiring width of each of the first and second dummy word lines is set to Wdw.

4. The device according to claim 1, wherein wiring length Ldw of each of the first and second dummy word lines is set to Ldw=1/p (where p denotes the number of parallel connections and is a natural number not smaller than 2) of wiring length Lnw of the normal word line.

5. The device according to claim 1, wherein a parallel-connected dummy word line which contains the first dummy word line and the second dummy word line connected in parallel with the first dummy word line is a folded word line.

6. The device according to claim 5, wherein a folded position of the parallel-connected dummy word line is set at Lnw=1/(p×2) (where Lnw denotes wiring length of the normal word line and p denotes the number of parallel connections and is a natural number not smaller than 2).

7. The device according to claim 1, wherein the plurality of normal bit cells, the plurality of structural dummy bit cells and the plurality of timing dummy bit cells are integrated on a memory cell way and the plurality of structural dummy bit cells and the plurality of timing dummy bit cells are arranged in a peripheral portion of the memory cell array.

8. The device according to claim 1, further comprising:
a dummy bit line; and
an operation timing control circuit which creates a control signal for controlling operation timing of the semiconductor integrated circuit device based on potential of the dummy bit line;
wherein the dummy bit line is electrically connected to the plurality of timing dummy bit cells.

9. The device according to claim 8, wherein the operation timing control circuit controls data readout timing.

10. The device according to claim 8, further comprising:
a plurality of normal bit lines electrically connected to the plurality of normal bit cells; and a plurality of sense amplifiers electrically connected to the plurality of normal bit lines, respectively;
wherein the operation timing control circuit controls timing at which the plurality of sense amplifiers are driven.

* * * * *

UNITED STATES PATENT AND TRADEMARK OFFICE
CERTIFICATE OF CORRECTION

PATENT NO. : 6,977,834 B2
APPLICATION NO. : 10/769192
DATED : December 20, 2005
INVENTOR(S) : Tadashi Onizawa et al.

It is certified that error appears in the above-identified patent and that said Letters Patent is hereby corrected as shown below:

On the title page, delete assignee and add
(73)   Assignee: Kabushiki Kaisha Toshiba. Tokyo (JP)

Signed and Sealed this

Nineteenth Day of September, 2006

JON W. DUDAS
*Director of the United States Patent and Trademark Office*